(12) United States Patent
Shing et al.

(10) Patent No.: US 11,715,665 B2
(45) Date of Patent: Aug. 1, 2023

(54) HEIGHT ADJUSTABLE SEMICONDUCTOR WAFER SUPPORT

(71) Applicant: TAIWAN SEMICONDUCTOR MANUFACTURING COMPANY LIMITED, Hsin-Chu (TW)

(72) Inventors: Ming Shing, Hsinchu County (TW); Yichi Yen, Hsinchu (TW); Chun Liang Chen, Taoyuan (TW); Kuo Lun Lo, Hsinchu County (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 687 days.

(21) Appl. No.: 16/787,106

(22) Filed: Feb. 11, 2020

(65) Prior Publication Data
US 2021/0249298 A1    Aug. 12, 2021

(51) Int. Cl.
*H01L 21/687* (2006.01)

(52) U.S. Cl.
CPC .. *H01L 21/68764* (2013.01); *H01L 21/68771* (2013.01); *H01L 21/68785* (2013.01)

(58) Field of Classification Search
CPC ......... H01L 21/68764; H01L 21/68771; H01L 21/68785; H01L 21/68742; H01L 21/683
See application file for complete search history.

(56) References Cited

U.S. PATENT DOCUMENTS

| | | | |
|---|---|---|---|
| 2008/0134814 A1* | 6/2008 | Kim | H01L 21/68742 118/500 |
| 2019/0189498 A1* | 6/2019 | Gangakhedkar | H01L 21/68785 |

FOREIGN PATENT DOCUMENTS

| | | |
|---|---|---|
| JP | 2008235494 A | 10/2008 |
| KR | 20070080536 A * | 8/2007 |
| KR | 20090088731 A * | 8/2009 |
| KR | 102469123 B1 * | 11/2022 |

\* cited by examiner

*Primary Examiner* — Mahdi H Nejad
(74) *Attorney, Agent, or Firm* — Cooper Legal Group, LLC

(57) ABSTRACT

A height adjustable semiconductor wafer support is provided. The height adjustable semiconductor wafer support includes a chuck for supporting a semiconductor wafer, an adjustment mechanism having a top surface for supporting the chuck, and a stage coupled to the adjustment mechanism such that movement of the top surface of the adjustment mechanism relative to the stage changes a distance between the top surface of the adjustment mechanism and a top surface of the stage.

20 Claims, 11 Drawing Sheets

HEIGHT ADJUSTABLE SEMICONDUCTOR WAFER SUPPORT

BACKGROUND

During semiconductor fabrication, semiconductor wafers are supported on one or more supports while undergoing one or more processes, such as fabrication and/or inspection.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
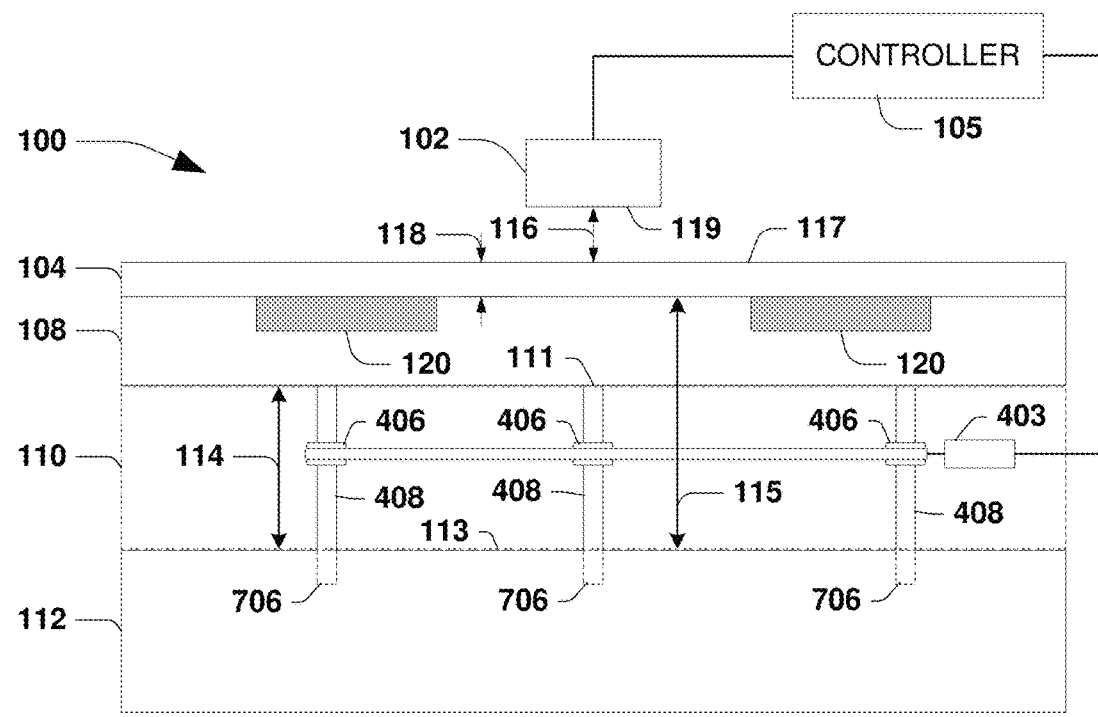
FIG. 1 illustrates a side view of a height adjustable semiconductor wafer support, according to some embodiments.

The following disclosure provides many different embodiments, or examples, for implementing different features of the provided subject matter. Specific examples of components and arrangements are described below to simplify the present disclosure. These are, of course, merely examples and are not intended limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to some embodiments, a height adjustable semiconductor wafer support is provided. The height adjustable semiconductor wafer support allows a height of a semiconductor wafer, such as relative to an underlying stage, to be adjusted, according to some embodiments. In some embodiments, the height adjustable semiconductor wafer support includes a chuck for supporting a semiconductor wafer, an adjustment mechanism having a top surface for supporting the chuck, and a stage coupled to the adjustment mechanism such that movement of the top surface of the adjustment mechanism relative to the stage changes a distance between the top surface of the adjustment mechanism and a top surface of the stage. Given that the semiconductor wafer is supported by the chuck and that the chuck is supported on the top surface of the adjustment mechanism, a distance between the semiconductor wafer and the stage changes as the distance between the top surface of the adjustment mechanism and the top surface of the stage changes, according to some embodiments.

In some embodiments, the height adjustable semiconductor wafer support allows different size semiconductor wafers having different dimensions, such as thicknesses, diameters, circumferences, etc. to be processed using a single semiconductor wafer support, as opposed to requiring different semiconductor wafer supports, such as a different support for each different size semiconductor wafer. In some embodiments, the height adjustable semiconductor wafer support allows different size semiconductor wafers having different dimensions, such as thicknesses, diameters, circumferences, etc. to be processed using the same semiconductor fabrication equipment, as opposed to requiring different semiconductor fabrication equipment, such as respective pieces of fabrication equipment for each different size semiconductor wafer. In some embodiments, a first semiconductor wafer having a first size is moved by the height adjustable semiconductor wafer support so as to be a first distance from a first piece of fabrication equipment, such as an inspection tool, while a second semiconductor wafer having a second size is moved by the height adjustable semiconductor wafer support so as to be a second distance, such as less than the first distance, from the first piece of fabrication equipment. According to some embodiments, being able to place the different size semiconductor wafers different distances from the fabrication equipment allows the same fabrication equipment to be used for each of the different semiconductor wafers. According to some embodiments, semiconductor fabrication equipment, such as semiconductor wafer supports, fabrication tools, inspection tools, etc., is generally quite expensive such that being able to reduce the amount of semiconductor fabrication equipment needed, such as to process different size semiconductor wafers, results in significant savings. In some embodiments, enabling the use of the same semiconductor fabrication equipment to process different size semiconductor wafers allows savings to be achieved by reducing, such as to zero, at least one of time or labor otherwise required to change at least some of the semiconductor fabrication equipment to process different size semiconductor wafers.

FIG. 1 illustrates a side view of a height adjustable semiconductor wafer support 100, according to some embodiments. In some embodiments, the height adjustable semiconductor wafer support 100 includes a chuck 108 for supporting a semiconductor wafer 104, an adjustment mechanism 110, and a stage 112. According to some embodiments, the adjustment mechanism 110 comprises a motor 403, at least one wheel 406, at least one shaft 408, and a belt 404, and thus the adjustment mechanism 110 is illustrated in phantom to encompass these items. While three wheels 406 and three shafts 408 are illustrated, a different number of wheels 406 and shafts 408 are contemplated in some embodiments. According to some embodiments, the wheels 406 and shafts 408 are spaced apart from one another by any desired distances, which may or may not be equidistant. According to some embodiments, the adjustment mechanism 110 is coupled to the stage 112 such that movement of a top surface 111 of the adjustment mechanism 110 relative to the stage 112 changes a distance 114 between the top surface 111 of the adjustment mechanism 110 and a top surface 113 of the stage 112. Given that the semiconductor wafer 104 is supported by the chuck 108 and that the chuck 108 is supported on the top surface 111 of the adjustment mechanism 110, a distance 115 between the semiconductor wafer 104 and the stage 112 changes as the distance 114 between the top surface 111 of the adjustment mechanism 110 and the top surface 113 of the stage 112 changes, according to some embodiments. According to some embodiments, respective top surfaces of one or more shafts 408 correspond to the top surface 111 of the adjustment mechanism 110. As discussed further below and illustrated in other figures, the belt 404 is coupled to the wheels 406 and to the motor 403, and the wheels 406 are respectively coupled to the shafts 408, according to some embodiments. In some embodiments, the motor 403 causes the belt 404 to move, where movement of the belt rotates the wheels which causes the shafts to move in a vertical direction to change the distance 114 between the top surface 111 of the adjustment mechanism 110 and the top surface 113 of the stage 112. In some embodiments, one or more recesses 706 are formed in the stage 112 to accommodate or receive respective shafts 408, such as when the distance 114 is to be decreased. In some embodiments, the motor 403 is housed within a recess in the stage 112. In some embodiments, one or more of the wheels 406 are housed within respective recesses in the stage 112. In some embodiments, the belt 404 is housed within a recess in the stage 112.

According to some embodiments, the stage 112 is generally fixed relative to one or more pieces of semiconductor fabrication equipment 102, such as a metrology instrument, scanning instrument, inspection tool, processing tool, etc. According to some embodiments, given the fixed relationship between the stage 112 and the semiconductor fabrication equipment 102, a change in the distance 115 between the semiconductor wafer 104 and the stage 112 changes a distance 116 between a top surface 117 of the semiconductor wafer 104 and a bottom surface 119 of the semiconductor fabrication equipment 102. According to some embodiments, even though a thickness 118 may vary from one semiconductor wafer 104 to another semiconductor wafer 104, the ability to adjust the distance 115 between the semiconductor wafer 104 and the stage 112 allows the distance 116 between the top surface 117 of the semiconductor wafer 104 and the bottom surface 119 of the semiconductor fabrication equipment 102 to be maintained or otherwise adjusted as desired, regardless of semiconductor wafer thicknesses, to achieve a desired result from the semiconductor fabrication equipment 102.

In some embodiments, the height adjustable semiconductor wafer support 100 includes a controller 105, such as a computer, processor, memory, ASIC, etc. In some embodiments, the controller 105 is coupled to at least one of the motor 403 or the semiconductor fabrication equipment 102, such as to control the distance 116 to achieve a desired result. According to some embodiments, the semiconductor fabrication equipment 102 represents one or more items used for semiconductor fabrication, testing, metrology, etc. According to some embodiments, the semiconductor fabrication equipment 102 facilitates one or more of optical metrology, e-beam metrology, spectroscopic metrology, image processing, imaging inspection, etc. According to some embodiments, the semiconductor fabrication equipment 102 facilitates one or more of patterned wafer inspection, unpatterned wafer inspection, reticle inspection, photomask inspection, film analysis, surface measurement yield analysis, defect classification, etc. According to some embodiments, the semiconductor fabrication equipment 102 facilitates one or more of contamination detection, particle detection, particle count, particle classification, particle characterization, etc. According to some embodiments, the semiconductor fabrication equipment 102 facilitates one or more of pattern defect detection, surface anomaly detection, electrical failure detection, physical failure detection, etc. According to some embodiments, the semiconductor fabrication equipment 102 facilitates one or more of measurements with regard to efficacy of lithography, efficacy of etching, efficacy of deposition, efficacy of chemical mechanical planarization, etc. According to some embodiments, the semiconductor fabrication equipment 102 facilitates one or more of measurements with regard to alignment between layers, high-aspect-ratio features, contact hole profiles, process tool performance, feature/element dimensions, etc. According to some embodiments, the controller 105 controls operation of at least one of the semiconductor fabrication equipment 102 or the motor 403 to achieve a desired result, such as by adjusting the distance 116 so as to obtain one or more desired measurements. According to some embodiments, the controller 105 at least one of produces or implements instructions that facilitate a desired semiconductor fabrication process, such as deposition, chemical mechanical planarization, etching, etc.

According to some embodiments, the chuck 108 defines one or more recesses 120 that facilitate at least one of placement of the semiconductor wafer 104 onto the chuck 108 or removal of the semiconductor wafer 104 from the chuck 108. According to some embodiments, the one or more recesses 120 are configured to receive fingers, such as on a forklift, robotic arm, etc., that carry the semiconductor wafer 104, such as to at least one of place the semiconductor wafer 104 onto the chuck 108 or remove the semiconductor wafer 104 from the chuck 108.

Figure 2:
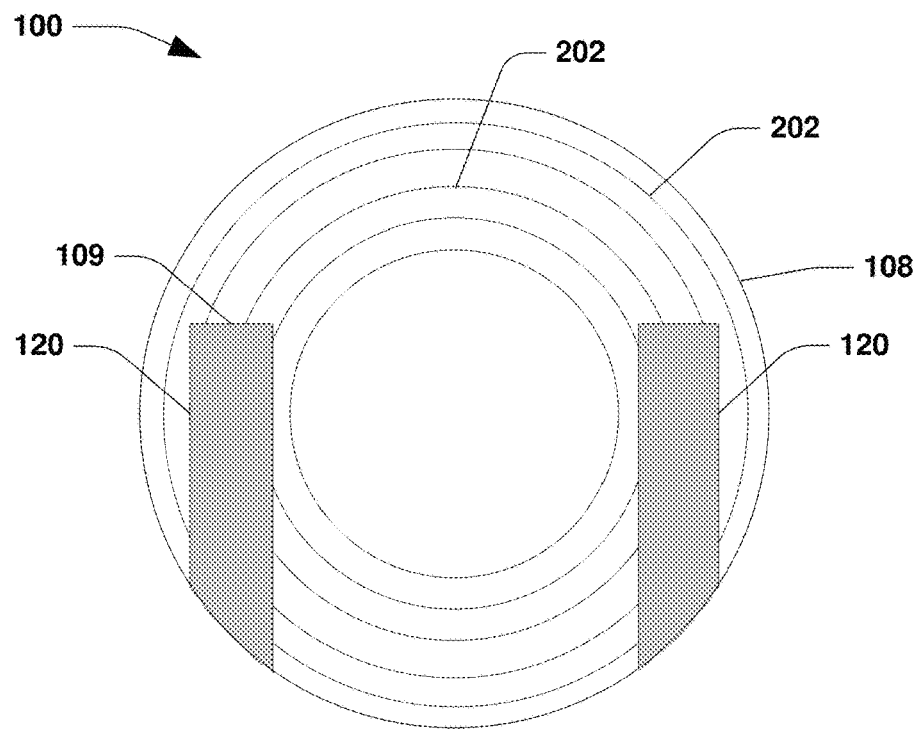
FIG. 2 illustrates a top view of a height adjustable semiconductor wafer support, according to some embodiments.

FIG. 2 illustrates a top view of the height adjustable semiconductor wafer support 100, according to some embodiments. According to some embodiments, the chuck 108 is generally round, such as for supporting a generally round semiconductor wafer (not shown). According to some embodiments, at least some of the one or more recesses 120 are defined within some but not all of the chuck 108, so as to not extend entirely across the chuck 108. In some embodiments, at least some of the one or more recesses 120 are rectangular or other shape(s) to accommodate one or more correspondingly shaped fingers (not shown). According to some embodiments, an end wall 109 defines a termination or end of a recess. According to some embodiments, a finger is halted from advancing upon encountering the end wall 109 such that a semiconductor wafer is centrally or otherwise desirably placed on the chuck 108. According to some embodiments, the chuck 108 defines one or more grooves 202. According to some embodiments, at least some of the one or more grooves 202 are circular. According to some embodiments, at least some of the one or more grooves 202 are concentric relative to another groove.

Figure 3:
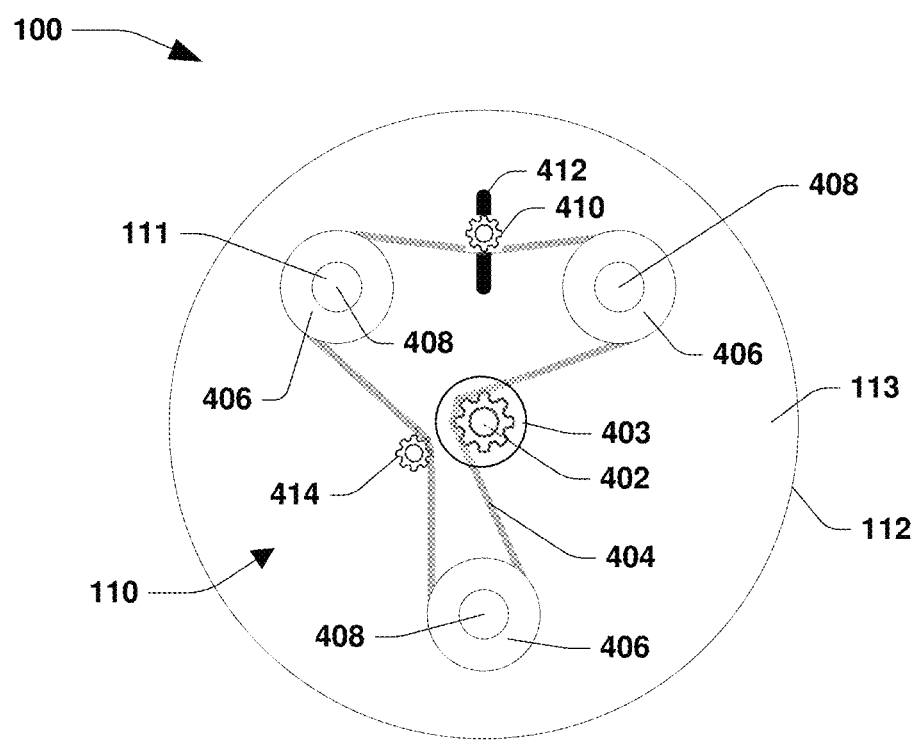
FIG. 3 illustrates a top view of a height adjustable semiconductor wafer support, according to some embodiments.

FIG. 3 illustrates a top view of the height adjustable semiconductor wafer support 100, according to some embodiments. According to some embodiments, at least some of the adjustment mechanism 110 is on, in, supported by, integral with, etc. the stage 112. According to some embodiments, the adjustment mechanism 110 includes a drive member 402, such as a gear, coupled to the motor 403 that drives, such as rotates, the drive member 402. In some embodiments, the motor 403 is situated other than illustrated, such as other than concentric, relative to the motor 403. According to some embodiments, at least some of the motor 403 is situated on the top surface 113 of the stage 112. According to some embodiments, at least some of the motor 403 is situated below the top surface 113 of the stage 112, such as within a recess defined within the stage 112. According to some embodiments, the drive member 402 includes a shaft and the motor 403 rotates the shaft, such as to rotate other aspects of the drive member 402. According to some embodiments, the motor 403 includes a mating portion, such as teeth, that mates or otherwise cooperates with a corresponding mating portion, such as teeth, on the drive member 402 to drive the drive member 402. According to some embodiments, at least some of the drive member 402 is situated on the top surface 113 of the stage 112. According to some embodiments, at least some of the drive member 402 is situated below the top surface 113 of the stage 112, such as within a recess defined within the stage 112.

According to some embodiments, the adjustment mechanism 110 includes the belt 404. According to some embodiments, the motor 403, through the drive member 402, moves the belt 404 in at least one of a first direction, such as clockwise, or a second direction, such as counterclockwise. According to some embodiments, the drive member 402 includes a mating portion, such as teeth, that mates or otherwise cooperates with a corresponding mating portion, such as slits, grit, etc., on the belt 404 to move the belt 404. According to some embodiments, the belt 404 does not have a mating member such that the drive member 402 cooperates with a surface of the belt 404.

According to some embodiments, the adjustment mechanism 110 includes one or more wheels 406. According to some embodiments, at least some of the one or more wheels 406 are situated on the top surface 113 of the stage 112. According to some embodiments, at least some of the one or more wheels 406 are situated below the top surface 113 of the stage 112, such as within a recess defined within the stage 112. According to some embodiments, movement of the belt 404 in the first direction rotates the one or more wheels 406 in a first rotational direction. According to some embodiments, movement of the belt 404 in the second direction rotates the one or more wheels 406 in a second rotational direction. According to some embodiments, at least some of the one or more wheels 406 include a mating portion, such as teeth, that mates or otherwise cooperates with a corresponding mating portion, such as slits, grit, etc., on the belt 404 to be rotated by the belt 404. According to some embodiments, the belt 404 does not have a mating member such that a surface of the belt 404 cooperates with the one or more wheels 406.

According to some embodiments, the adjustment mechanism 110 includes one or more shafts 408. According to some embodiments, at least some of the one or more shafts 408 are situated on the top surface 113 of the stage 112. According to some embodiments, at least some of the one or more shafts 408 are situated below the top surface 113 of the stage 112, such as within a recess defined within the stage 112. According to some embodiments, a top surface of at least one of the one or more shafts 408 defines the top surface 111 of the adjustment mechanism 110. According to some embodiments, rotation of a wheel 406 in a first rotational direction moves a shaft 408 in a first vertical direction to change the distance 114 (FIG. 1) between the top surface 111 of the adjustment mechanism 110 and the top surface 113 of the stage 112, wherein the first vertical direction corresponds to a longitudinal axis of the shaft 408. According to some embodiments, rotation of the wheel 406 in a second rotational direction moves the shaft 408 in a second vertical direction, opposite the first vertical direction, to change the distance 114 (FIG. 1) between the top surface 111 of the adjustment mechanism 110 and the top surface 113 of the stage 112. According to some embodiments, at least some of the one or more shafts 408 include a mating portion, such as a tab, groove, etc., that mates or otherwise cooperates with a corresponding mating portion, such as a tab, groove, etc., on a wheel 406.

According to some embodiments, the adjustment mechanism 110 includes a tensioner 410 coupled to the belt 404 to adjust tension in the belt. According to some embodiments, tensioner 410 travels within a slot 412 to place more or less tension on the belt 404 and is locked in place in the slot when a desired amount of tension is on the belt 404. According to some embodiments, at least some of the tensioner 410 is situated on the top surface 113 of the stage 112. According to some embodiments, at least some of the tensioner 410 is situated below the top surface 113 of the stage 112, such as within a recess defined within the stage 112. In some embodiments, the adjustment mechanism 110 includes a diverter 414 to locate the belt 404 at a desired position relative to the stage 112, such as to be out of the way of one or more fingers that that carry the semiconductor wafer. According to some embodiments, at least some of the diverter 414 is situated on the top surface 113 of the stage 112. According to some embodiments, at least some of the diverter 414 is situated below the top surface 113 of the stage 112, such as within a recess defined within the stage 112.

Figure 4:
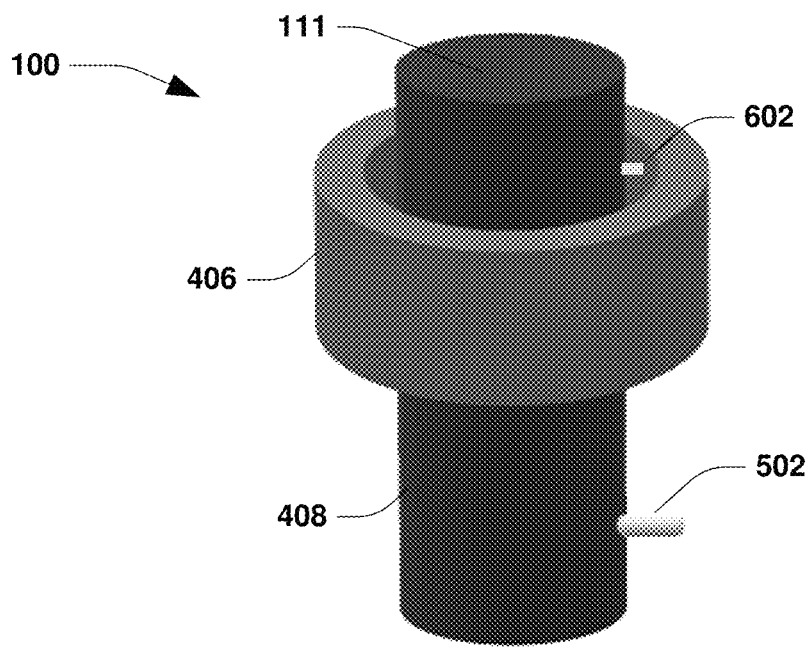
FIG. 4 illustrates a perspective view of a wheel and a shaft of a height adjustable semiconductor wafer support, according to some embodiments.

FIG. 4 illustrates a perspective view of a wheel 406 and a shaft 408 of the height adjustable semiconductor wafer support 100, according to some embodiments. According to some embodiments, the wheel 406 surrounds or is concentric to the shaft 408. According to some embodiments, the shaft 408 is longer than the wheel 406 and moves up and down in a vertical direction relative to the wheel 406, where the vertical direction corresponds to a longitudinal axis of the shaft and movement of the shaft 408 is in response to rotation of the wheel 406. According to some embodiments, the wheel 406 rotates relative to the top surface 113 (FIG. 1) of the stage 112 but has little to no vertical movement relative to the top surface 113 of the stage 112. According to some embodiments, given that the shaft 408 moves in the vertical direction relative to the wheel 406 but that the wheel 406 does not move in the vertical direction relative to the top surface 113 of the stage 112, the shaft 408 moves, responsive to rotation of the wheel 406, in the vertical direction relative to the top surface 113 of the stage. Given that an end of the shaft 408 corresponds to the top surface 111 of the adjustment mechanism 110, vertical movement of the shaft 408 changes the distance 114 (FIG. 1) between the top surface 111 of the adjustment mechanism 110 and the top surface 113 of the stage 112.

To facilitate such vertical movement of the shaft 408, the shaft 408 has a first shaft mating portion for mating with a first wheel mating portion of the wheel 406, according to some embodiments. According to some embodiments, cooperation between the first shaft mating portion and the first wheel mating portion yields the vertical movement of the shaft 408 as the wheel 406 rotates. According to some embodiments, the first shaft mating portion comprises a first tab 602 protruding from the shaft 408. According to some embodiments, the shaft 408 has a second shaft mating portion for mating with a second stage mating portion of the stage 112 (FIG. 1). According to some embodiments, cooperation between the second shaft mating portion and the second stage mating portion inhibits rotational movement of the shaft about the longitudinal axis as the shaft moves vertically when the wheel 406 rotates. According to some embodiments, the second shaft mating portion comprises a second tab 502 protruding from the shaft 408.

Figure 5:
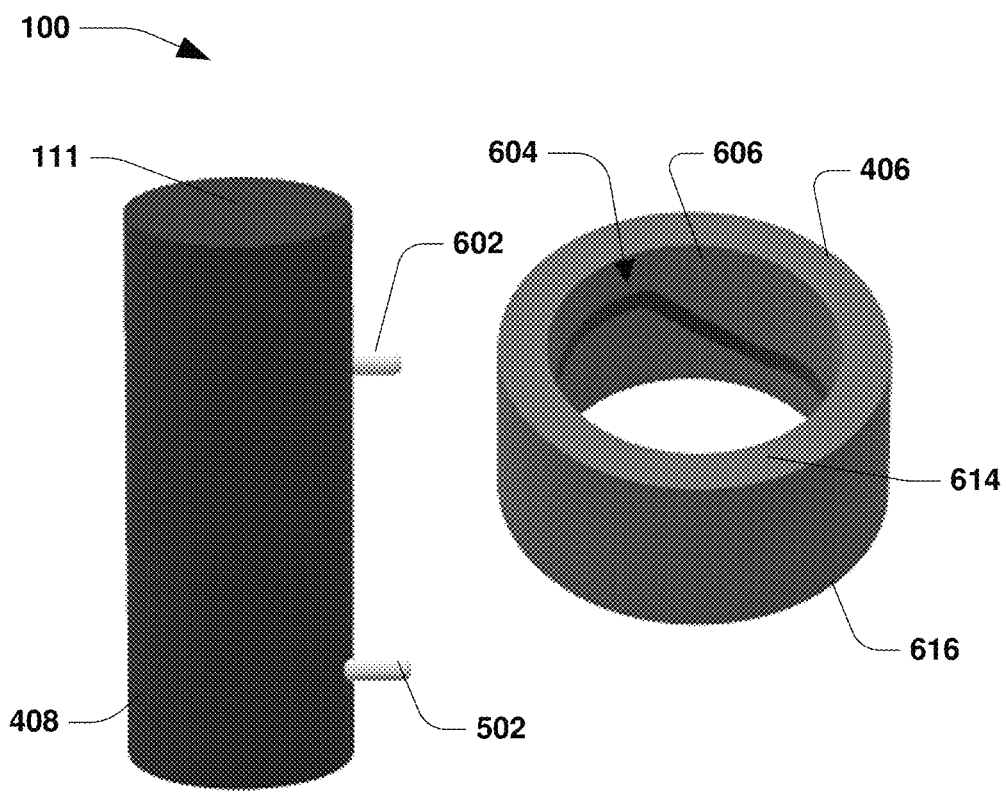
FIG. 5 illustrates a perspective view of a wheel and a shaft of a height adjustable semiconductor wafer support, according to some embodiments.

FIG. 5 illustrates a perspective view of the wheel 406 and the shaft 408 of the height adjustable semiconductor wafer support 100, according to some embodiments. In FIG. 5 the wheel 406 and the shaft 408 are shown uncoupled or with the shaft 408 not within the wheel 406 to illustrate, at least, the first wheel mating portion, according to some embodiments. In some embodiments, the first wheel mating portion comprises a first groove 604 formed within an inner sidewall 606 of the wheel 406.

According to some embodiments, a vertical measure, such as a distance between a top surface 614 of the wheel 406 and the first groove 604, varies around the inner sidewall 606 of the wheel 406. According to some embodiments, at least some of the first groove 604 has a constant non-zero slope or varies linearly in the vertical direction around the inner sidewall 606 of the wheel 406. According to some embodiments, at least some of the first groove 604 has a slope of zero or does not vary in the vertical direction around the inner sidewall 606 of the wheel 406.

According to some embodiments, the first tab 602 rides within the first groove 604 as the wheel 406 rotates. According to some embodiments, the shaft 408 moves in the vertical direction when the first tab 602 rides within a portion of the first groove 604 having a non-zero slope. According to some embodiments, the shaft 408 does not move in the vertical direction when the first tab 602 rides within a portion of the first groove 604 having a slope of zero. According to some embodiments, the wheel 406 can be rotated to place the first tab 602 within a first horizontal or zero slope portion of the first groove 604 to 'park' the shaft 408 at a first vertical position and place the semiconductor wafer 104 (FIG. 1) a first distance from the top surface 113 of the stage 112. According to some embodiments, the wheel 406 can be rotated to transition the first tab 602 from the first horizontal portion of the first groove 604, through a non-zero sloped or non-horizontal portion of the first groove 604, to a second horizontal or zero slope portion of the first groove 604, where the second horizontal portion of the first groove 604 is at a different elevation or vertical position than the first horizontal portion of the first groove 604, to 'park' the shaft 408 at a second vertical position and place the semiconductor wafer 104 (FIG. 1) a second distance from the top surface 113 of the stage 112.

According to some embodiments, the first groove 604 has any number of horizontal portions to achieve a desired granularity or number of vertical positions for the shaft, and thus distances between the semiconductor wafer 104 (FIG. 1) and the top surface 113 of the stage 112. According to some embodiments, some portions of the first groove 604 have different slopes such that, as the wheel 406 rotates at a constant velocity, an amount of movement of the shaft 408 in the vertical direction is different when the first tab 602 rides within a first portion of the first groove 604 having a first non-zero slope as compared to when the first tab 602 rides within a second portion of the first groove 604 having a second non-zero slope. According to some embodiments, some portions of the first groove 604 that have a non-zero slope have different lengths as measured in the horizontal direction. According to some embodiments, some portions of the first groove 604 that have a slope of zero have different lengths as measured in the horizontal direction, such that, as the wheel 406 rotates at a constant velocity, a lack of movement of the shaft 408 in the vertical direction persists for a longer period of time when the first tab 602 rides within a first portion of the first groove 604 having a slope of zero as compared to when the first tab 602 rides within a second portion of the first groove 604 having a slope of zero.

According to some embodiments, the first groove 604 does not extend past at least one of the top surface 614 of the wheel 406 or a bottom surface 616 of the wheel 406 so that the wheel 406 does not 'spin off' the shaft 408, or that the first tab 602 continues to ride within the first groove 604 even as the wheel 406 rotates more than 360 degrees. According to some embodiments, the first tab 602 is spaced apart from the second tab 502 such that the wheel 406 does not contact the second tab 502 as the shaft 408 moves up and down as the wheel 406 rotates and the first tab 602 rides within the first groove 604.

Figure 6:
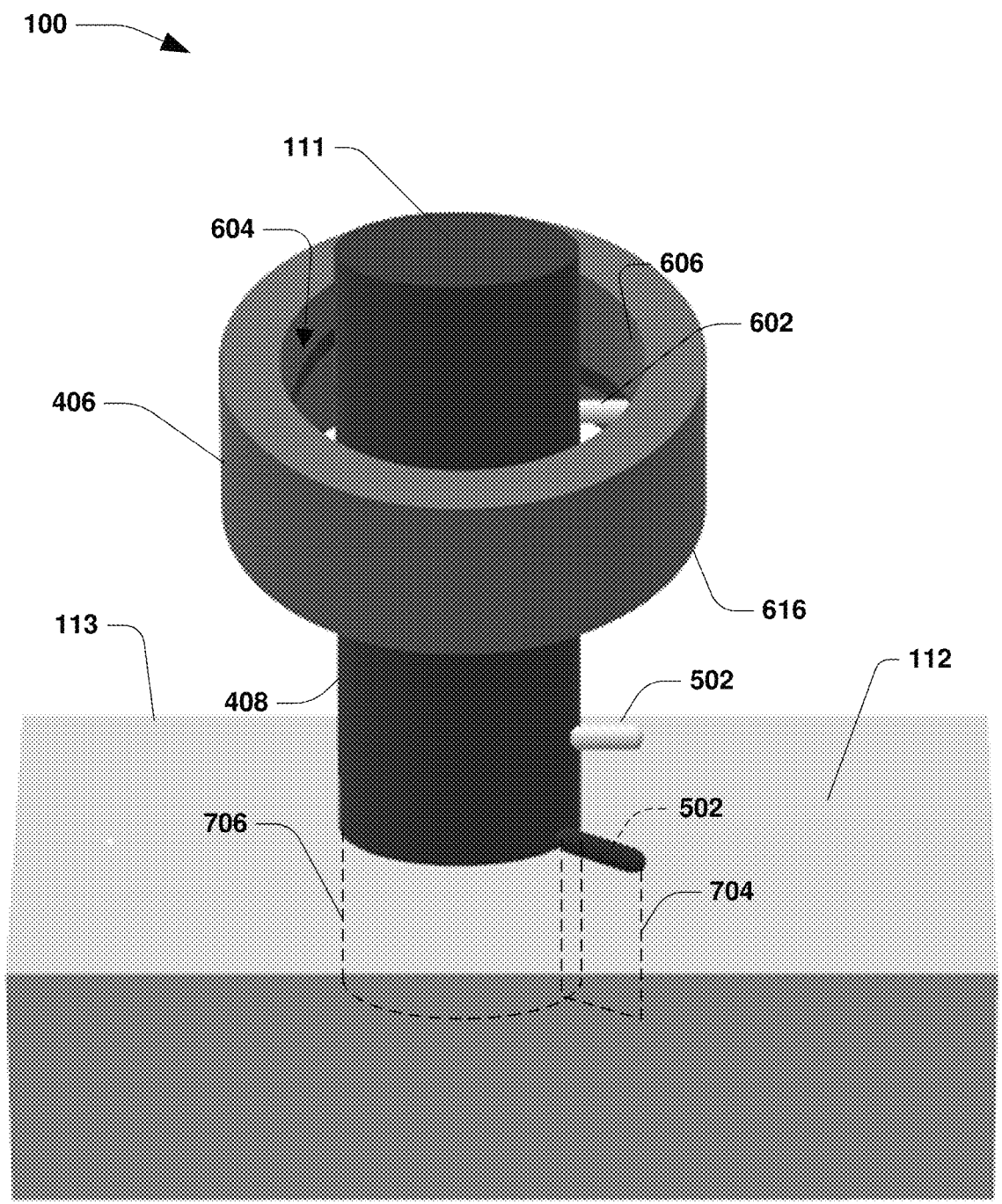
FIG. 6 illustrates a perspective view of a wheel, a shaft, and a stage of a height adjustable semiconductor wafer support, according to some embodiments.

FIG. 6 illustrates a perspective view of the wheel 406, the shaft 408, and a portion of the stage 112 of the height adjustable semiconductor wafer support 100, according to some embodiments. According to some embodiments, the recess 706 is defined within the stage 112 such that the shaft 408 plunges down into and up out of the recess 706 as the shaft 408 moves up and down as the wheel 406 rotates. According to some embodiments, the second stage mating portion comprises a second groove 704 in the stage 112, such that the second tab 502 rides up and down in the second groove 704 as the shaft 408 moves up and down. According to some embodiments, the second groove 704 is dimensioned, relative to the second tab 502, to inhibit rotational movement of the shaft 408 about the longitudinal axis as the wheel 406 rotates, such that rotation of the wheel 406 substantially translates to vertical movement of the shaft 408 as opposed to rotational movement of the shaft 408. According to some embodiments, the wheel 406 undergoes little to no vertical movement, but rather primarily rotates due to movement of the belt 404 (FIG. 3). According to some embodiments, the bottom surface 616 of the wheel 406 contacts or is in close proximity to the top surface 113 of the stage 112.

Figure 7:
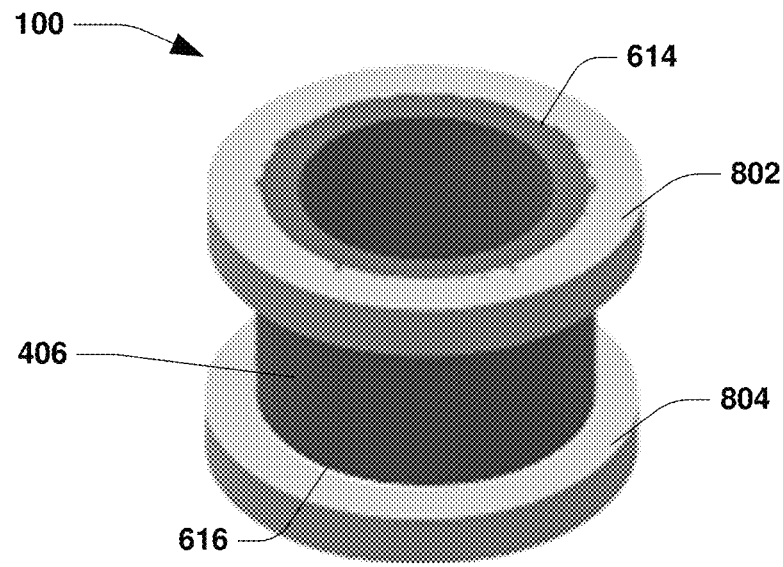
FIG. 7 illustrates a perspective view of a wheel of a height adjustable semiconductor wafer support, according to some embodiments.

FIG. 7 illustrates a perspective view of a wheel 406 of the height adjustable semiconductor wafer support 100, according to some embodiments. According to some embodiments, the wheel 406 has at least one of an upper flange 802 or a lower flange 804 to inhibit detachment of the belt 404 (FIG. 3) from the wheel 406, such as might otherwise occur by the belt 404 riding up over the top surface 614 of the wheel 406 or down off the bottom surface 616 of the wheel 406.

Figure 8:
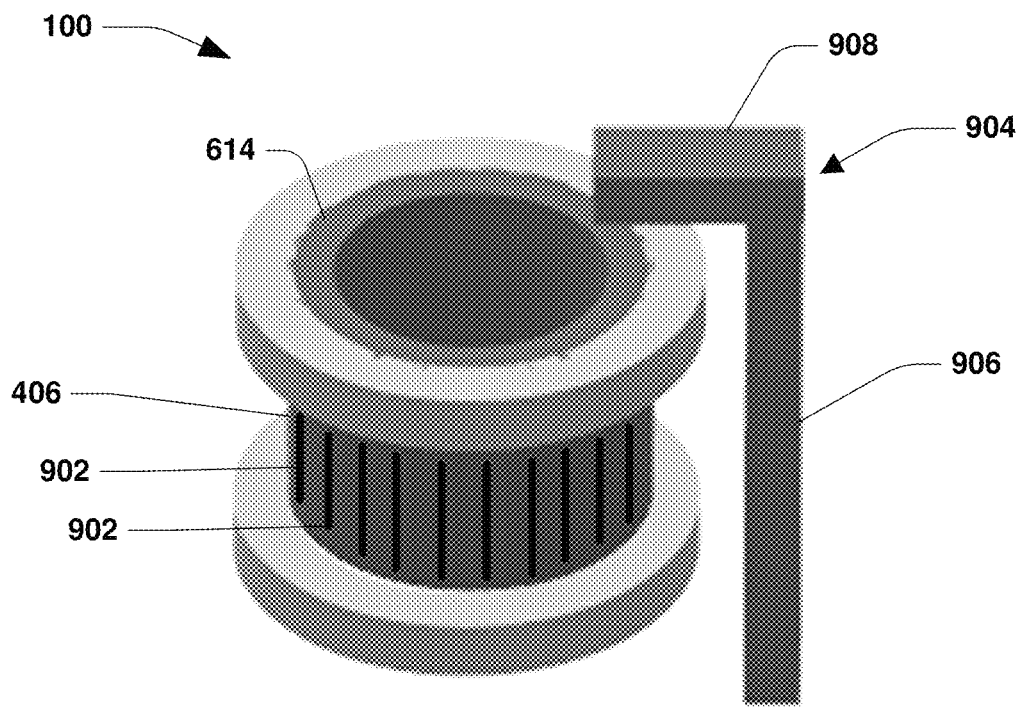
FIG. 8 illustrates a perspective view of a wheel of a height adjustable semiconductor wafer support, according to some embodiments.

FIG. 8 illustrates a perspective view of a wheel 406 and a vertical wheel stop 904 of the height adjustable semiconductor wafer support 100, according to some embodiments. According to some embodiments, the wheel 406 include one or more mating portions 902, such as teeth, that mate or otherwise cooperates with the belt 404 (FIG. 3) to facilitate rotation of the wheel 460 by the belt 404. According to some embodiments, the vertical wheel stop 904 has a first portion 906, such as attached to the top surface 113 of the stage 112, and a second portion 908 over the wheel 406. According to some embodiments, the second portion 908 is in close proximity to at least one of the upper flange 802 or the top surface 614 of the wheel 406. According to some embodiments, should the wheel 406 undergo vertical movement, the wheel 406 encounters the second portion 908 such that such vertical movement of the wheel 406 is halted or constrained.

Figure 9:
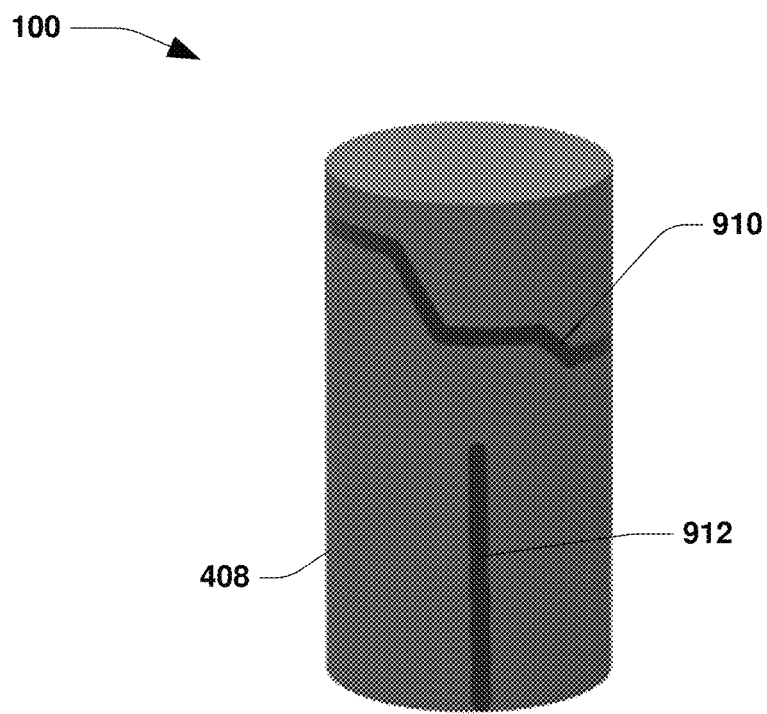
FIG. 9 illustrates a perspective view of a shaft of a height adjustable semiconductor wafer support, according to some embodiments.
Figure 10:
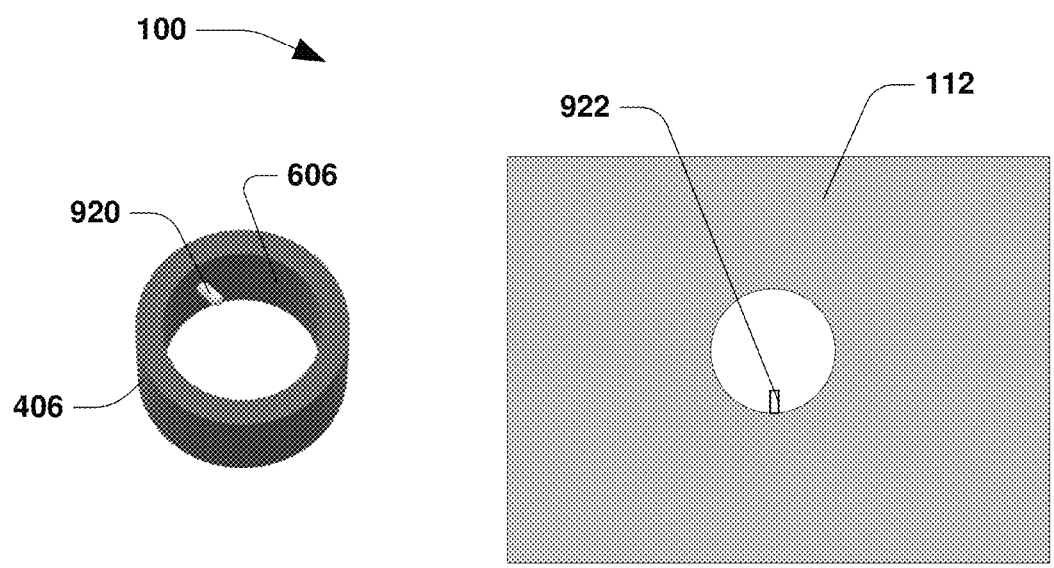
FIG. 10 illustrates a perspective view of a wheel and a top view of a stage of a height adjustable semiconductor wafer support, according to some embodiments.

FIG. 9 and FIG. 10 illustrate the wheel 406, the shaft 408, and a portion of the stage 112 of the height adjustable semiconductor wafer support 100, according to some embodiments. According to some embodiments, the first shaft mating portion comprises a first groove 910 in the shaft 408 and the first wheel mating portion comprises a first tab 920 on the wheel 406. According to some embodiments, cooperation between the first shaft mating portion and the first wheel mating portion occurs as previously described to facilitate vertical movement of the shaft 408 and thus relative vertical positioning of the semiconductor wafer 104 (FIG. 1). According to some embodiments, the second shaft mating portion comprises a second groove 912 in the shaft 408 and the second stage mating portion comprises a second tab 922 on the stage 112. According to some embodiments, cooperation between the second shaft mating portion and the second stage mating portion occurs as previously described to inhibit movement of the shaft 408.

Figure 11:
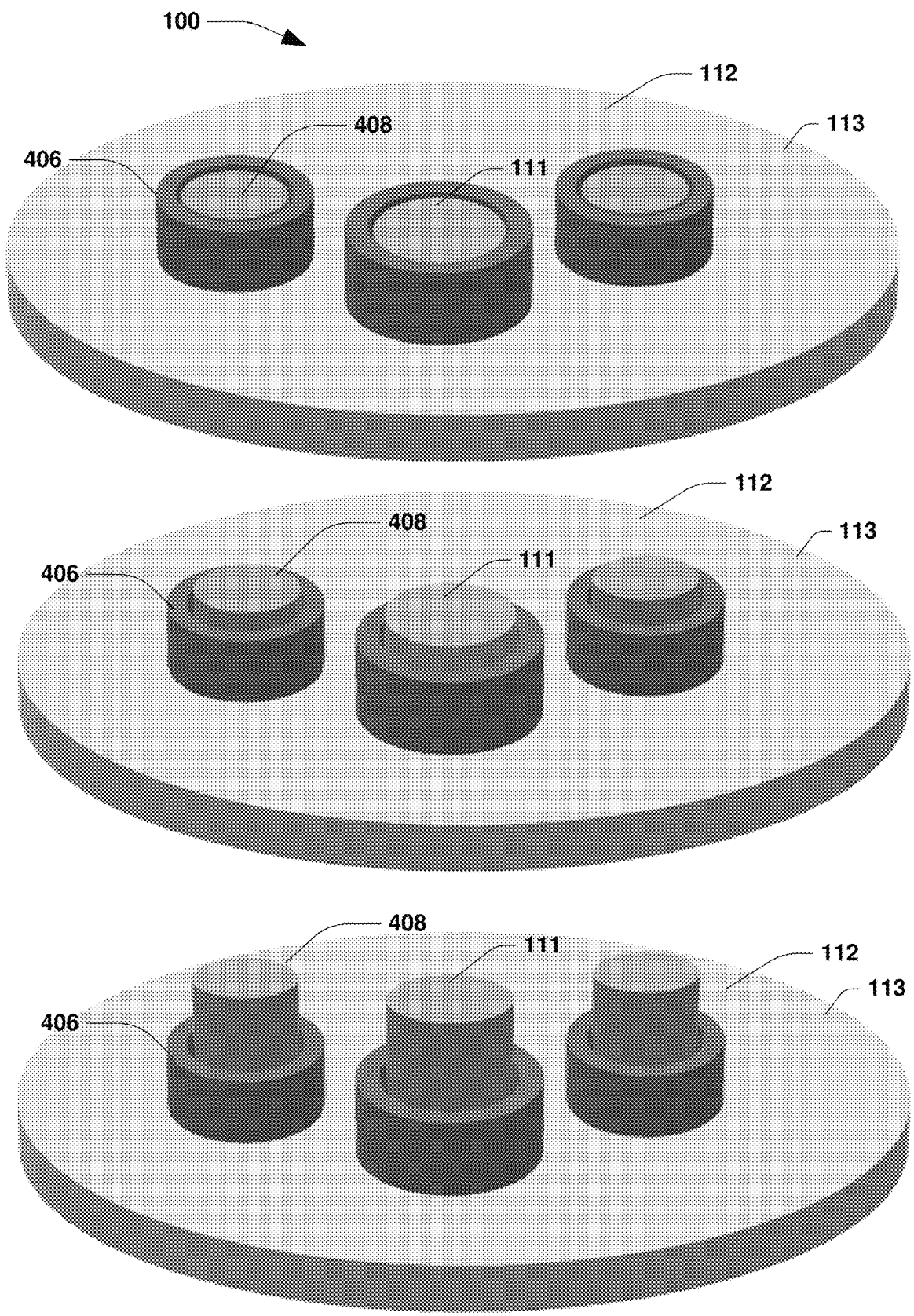
FIG. 11 illustrates a perspective view of three different states of a height adjustment mechanism, according to some embodiments.

FIG. 11 illustrates a perspective view of three different states of the height adjustable semiconductor wafer support 100, according to some embodiments. Although three shafts 408 and three wheels 406 are illustrated, any number of shafts and wheels are contemplated, according to some embodiments. The shafts 408 are illustrated at three different heights such that the distance 114 between the top surface 111 of the shafts 408 and the top surface 113 of the stage 112 has three different values, thus placing the semiconductor wafer 104 (FIG. 1) at three different vertical positions.

Figure 12:
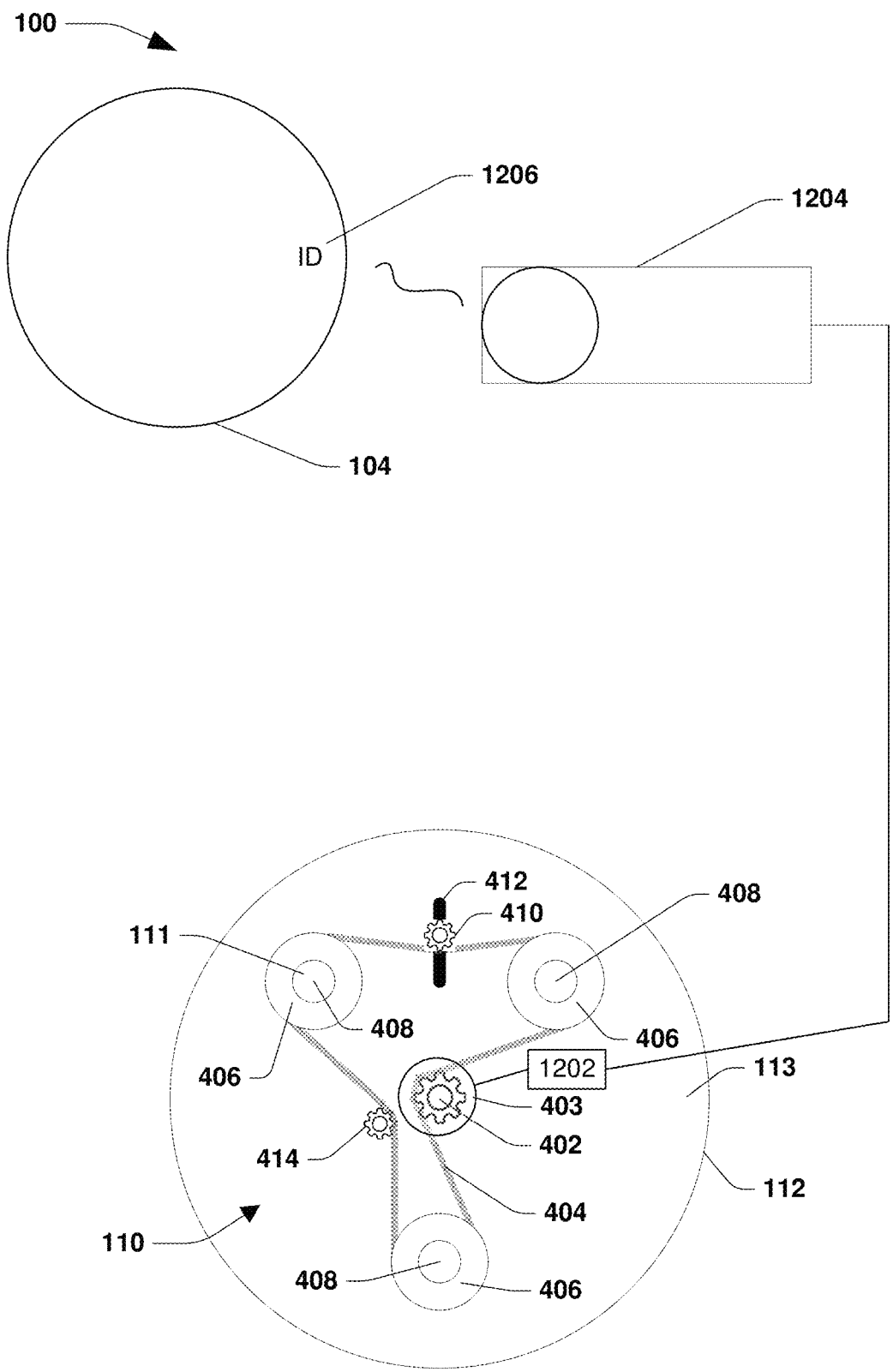
FIG. 12 illustrates a top view of a height adjustable semiconductor wafer support, according to some embodiments.

FIG. 12 illustrates a top view of the height adjustable semiconductor wafer support 100, according to some embodiments. According to some embodiments, a controller 1202 is coupled to the motor 403 to control operation of the motor 403. According to some embodiments, the controller 1202 corresponds to the controller 105 in FIG. 1. According to some embodiments, an identification (ID) reader 1204 is proximate the semiconductor wafer 104 to read an ID 1206 of the semiconductor wafer 104. According to some embodiments, the ID 1206 is a bar code or the like or a measurement, such as taken by the ID reader 1204, of a size, dimension, etc. of the semiconductor wafer 104 to characterize of otherwise identify the semiconductor wafer 104. According to some embodiments, the ID reader 1204 is coupled to the controller 1202 so that the controller 1202 controls operation of the motor 403 according to the ID, size, characterization, etc. of the semiconductor wafer 104. According to some embodiments, the controller 1202 controls the motor 403 so that the belt moves and the wheels 406 rotate to move the shafts 408 as desired to place the semiconductor wafer 104 at a desired elevation, such as in proximity to a piece of semiconductor fabrication equipment, such as the semiconductor fabrication equipment 102 in FIG. 1, given the reading taken by the ID reader 1204. According to some embodiments, the height adjustable semiconductor wafer support 100 provides, among other things, flexibility by moving different size, such as thicknesses, diameters, etc., semiconductor wafers to desired positions relative to semiconductor fabrication equipment.

Figure 13A:
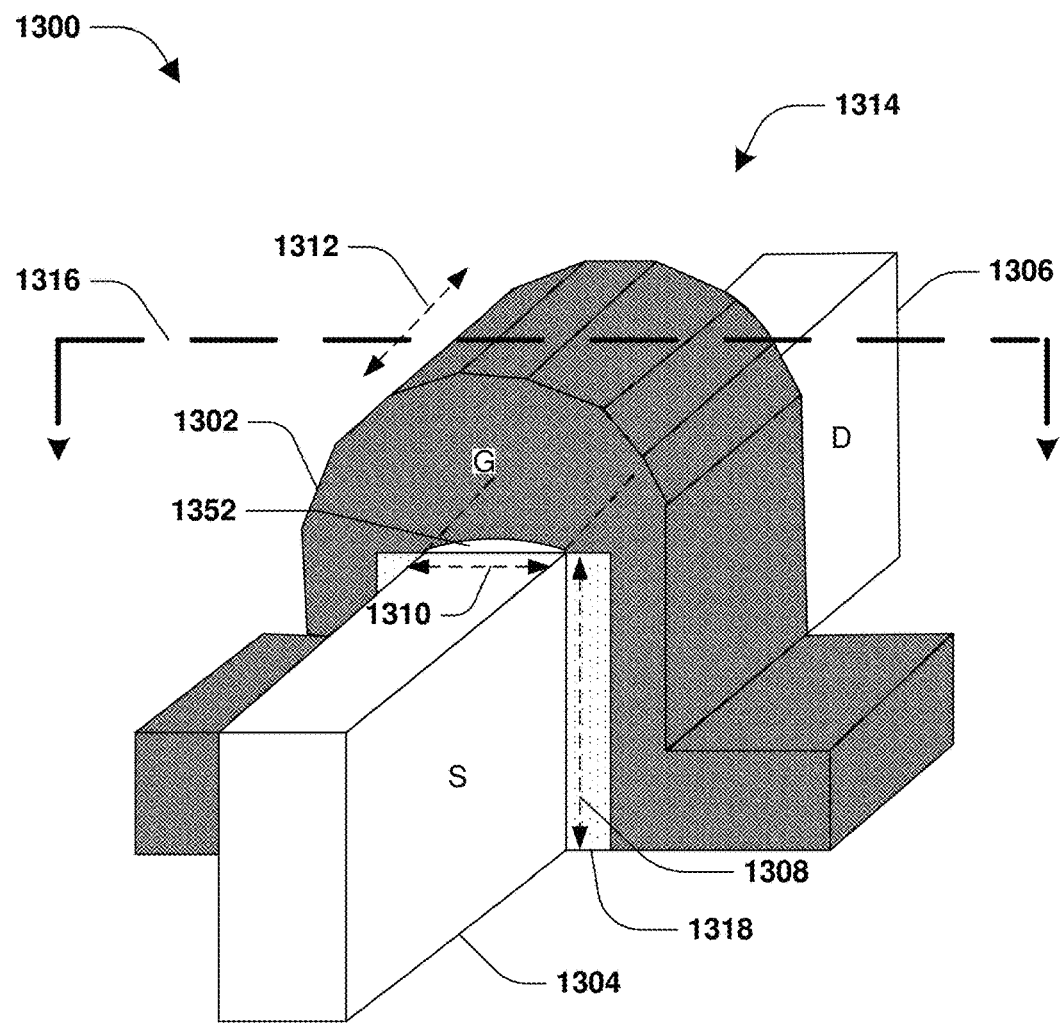
FIG. 13A illustrates a perspective view of a semiconductor device with which a height adjustable semiconductor wafer support is used, according to some embodiments.
Figure 13B:
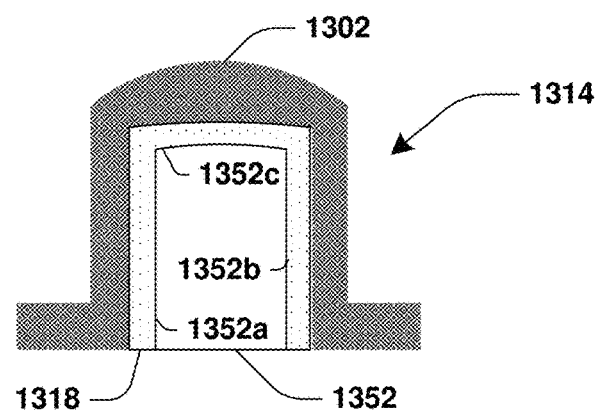
FIG. 13B illustrates a cross sectional view of a semiconductor device with which a height adjustable semiconductor wafer support is used, according to some embodiments.

FIG. 13A and FIG. 13B illustrate at least some of a semiconductor device 1300 formed on or in at least some of a semiconductor wafer, such as the semiconductor wafer 104 in FIG. 1, according to some embodiments. In some embodiments, a piece of semiconductor fabrication equipment, such as at least some of the semiconductor fabrication equipment 102 in FIG. 1, operates on the semiconductor device 1300. According to some embodiments, the semiconductor device 1300 comprises a FinFET device 1314, where FIG. 13B illustrates a cross sectional view of the FinFET device 1314 taken along line 1316 of FIG. 13A through a gate region (G) 1302 and a channel region 1352 of the FinFET device 1314. According to some embodiments, the FinFET device 1314 comprises a source region (S) 1304 and a drain region (D) 1306. According to some embodiments, the channel region 1352 is positioned between the source region 1304 and the drain region 1306. According to some embodiments, the gate region 1302 of the FinFET device 1314 wraps around one or more surfaces of the channel region 1352, such as a first vertical surface 1352a, a second vertical surface 1352b, and a top surface 1352c, as illustrated in FIG. 13B. According to some embodiments, a dielectric layer 1318 is positioned between the gate region 1302 and the channel region 1352. According to some embodiments, the source region 1304, the channel region 1352, and the drain region 1306 are comprised within a fin of the FinFET device 1314, where the FinFET device 1314 comprises one or more fins. According to some embodiments, the gate region 1302 electrically controls the FinFET device 1314 by controlling the channel region 1352. According to some embodiments, responsive to a voltage being applied to the gate region 1302 or a lack of a voltage, the gate region 1302 modifies properties of the channel region 1352 so that current flows through the channel region 1352 between the source region 1304 and the drain region 1306, resulting in the FinFET device 1314 being in an ON state. According to some embodiments, control over the channel region 1352 is based upon at least one of a fin width 1310, a fin length 1312, or a fin height 1308. According to some embodiments, increasing the fin height 1308 improves electrical characteristics, such as speed or responsiveness, of the FinFET device 1314. According to some embodiments, the semiconductor wafer or portion thereof comprises multiple FinFET devices. According to some embodiments, variations in fin heights among different fins or among different FinFET devices, or both, results in variations in voltage thresholds and mismatched electrical indexes. According to some embodiments, adjusting the distance 116 as described at least with respect to FIG. 1 facilitates desired measurement of physical properties of the FinFET device 1314, such as at least one of the fin width 1310, the fin length 1312, the fin height 1308, variations in fin widths among different fins, variations in fin lengths among different fins, variations in fin heights among different fins, variations in fin widths among different FinFET devices, variations in fin lengths among different FinFET devices, or variations in fin heights among different FinFET devices. According to some embodiments, adjusting the distance 116 as described at least with respect to FIG. 1 facilitates desired measurement of electrical properties of the FinFET device 1314, such as at least one of current flow through the channel region 1352 responsive to a particular voltage applied to the gate region 1302, variations in current flow through channel regions 1352 of different fins responsive to the particular voltage being applied to gate regions 1302 of the different fins, or variations in current flow through channel regions 1352 of different FinFET devices responsive to the particular voltage being applied to gate regions 1302 of the different FinFET devices. According to some embodiments, adjusting the distance 116 as described at least with respect to FIG. 1 facilitates adjusting one or more fabrication processes, such deposition, etching, chemical mechanical planarization, etc. to achieve a desired result, such as adjusting one or more of of the fin width 1310, the fin length 1312, the fin height 1308, etc. According to some embodiments, one or more of the aforementioned measurements, adjustments, etc. are facilitated by the controller 105 (FIG. 1) at least one of during or after fabrication of the semiconductor device 1300, such as iteratively, in real time, in situ, etc.

Figure 14:
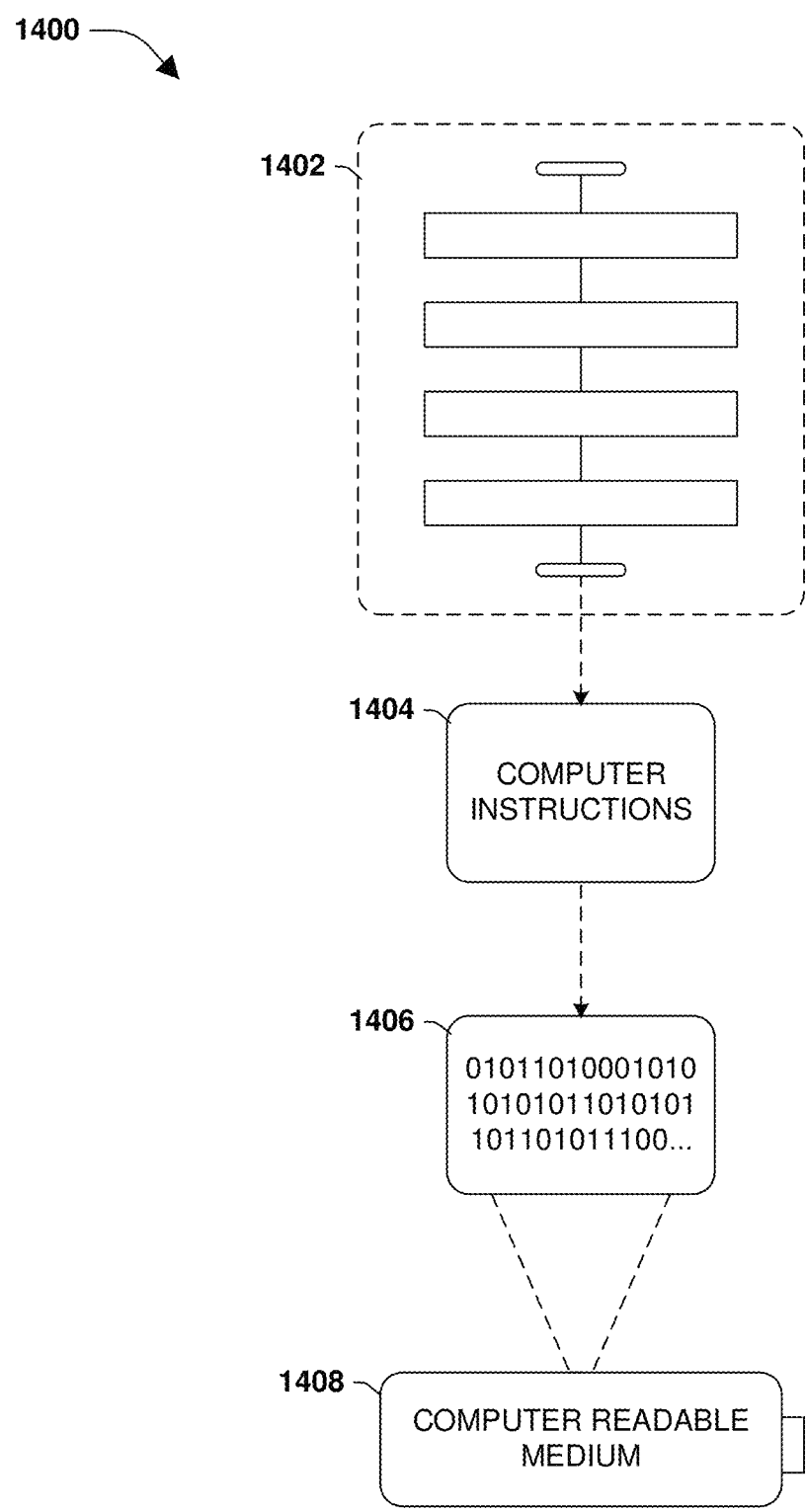
FIG. 14 illustrates an example computer-readable medium wherein processor-executable instructions configured to embody one or more of the provisions set forth herein are comprised, according to some embodiments.

FIG. 14 illustrates an example computer-readable medium wherein processor-executable instructions configured to embody one or more of the provisions set forth herein are comprised, according to some embodiments. In some embodiments, the implementation 1400 illustrated in FIG. 14 comprises a computer-readable medium 1408, such as a CD-R, DVD-R, flash drive, a platter of a hard disk drive, etc., on which is encoded computer-readable data 1406. According to some embodiments, the computer-readable data 1406, such as binary data comprising at least one of a zero or a one, in turn comprises a set of processor-executable computer instructions 1404 configured to operate according to one or more of the principles set forth herein. In some embodiments, the processor-executable computer instructions 1404 are configured to perform a method 1402, such as at least some of the operations described herein with regard to at least one of the controller 105 in FIG. 1 or the controller 1202 in FIG. 12. In some embodiments, the processor-executable computer instructions 1404 are configured to implement a system, such as at least some of the height adjustable semiconductor wafer support 100. Many such computer-readable media are devised by those of ordinary skill in the art that are configured to operate in accordance with the techniques presented herein.

As used in this application, the terms "component", "module," "system", "interface", and the like are generally intended to refer to a computer-related entity, either hardware, a combination of hardware and software, software, or software in execution. For example, a component may include a process running on a processor, a processor, an object, an executable, a thread of execution, a program, or a computer. By way of illustration, both an application running on a controller and the controller can be a component. One or more components may reside within a process or thread of execution and a component may be localized on one computer or distributed between two or more computers.

Furthermore, the claimed subject matter may be implemented as a method, apparatus, or article of manufacture using standard programming or engineering techniques to produce software, firmware, hardware, or any combination thereof to control a computer to implement the disclosed subject matter. The term "article of manufacture" as used herein is intended to comprise a computer program accessible from any computer-readable device, carrier, or media. Of course, many modifications may be made to this configuration without departing from the scope or spirit of the claimed subject matter.

Figure 15:
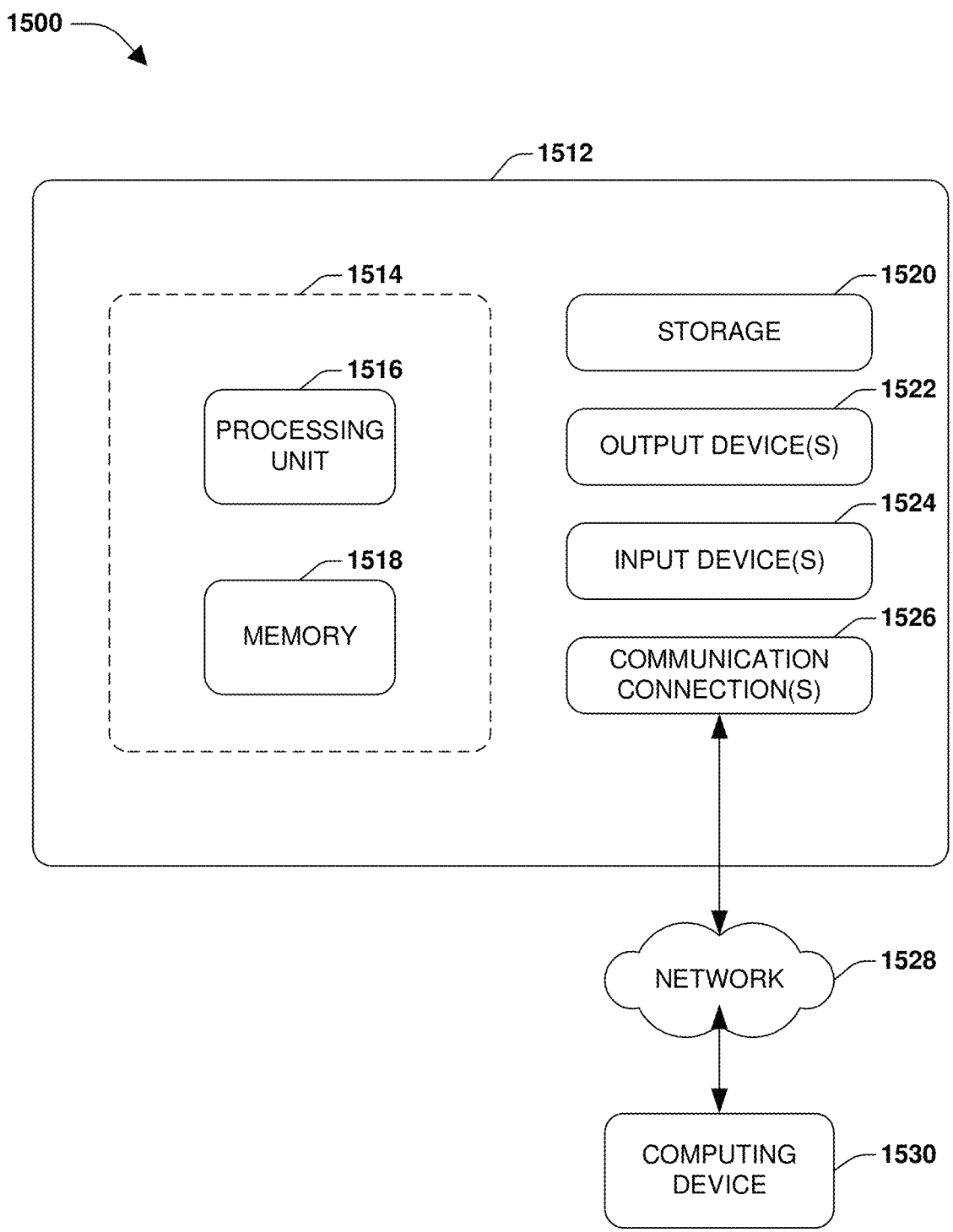
FIG. 15 illustrates an example computing environment wherein one or more of the provisions set forth herein are implemented, according to some embodiments.

FIG. 15 illustrates an example computing environment wherein one or more of the provisions set forth herein are implemented, according to some embodiments. The operating environment of FIG. 15 is only one example of a suitable operating environment and is not intended to suggest any limitation as to the scope of use or functionality of the operating environment. Example computing devices include, but are not limited to, personal computers, server computers, hand-held or laptop devices, mobile devices, such as mobile phones, Personal Digital Assistants (PDAs), media players, and the like, multiprocessor systems, consumer electronics, mini computers, mainframe computers, distributed computing environments that include any of the above systems or devices, and the like.

Generally, embodiments are described in the general context of "computer readable instructions" being executed by one or more computing devices. Computer readable instructions are distributed via computer readable media as will be discussed below. Computer readable instructions are implemented as program modules, such as functions, objects, Application Programming Interfaces (APIs), data structures, and the like, that perform particular tasks or implement particular abstract data types. Typically, the functionality of the computer readable instructions are combined or distributed as desired in various environments.

FIG. 15 illustrates an example of a system 1500 comprising a computing device 1512 configured to implement one or more embodiments provided herein, such as at least one of the controller 105 in FIG. 1 or the controller 1202 in FIG. 12. In a configuration, computing device 1512 includes at least one processing unit 1516 and memory 1518. In some embodiments, depending on the exact configuration and type of computing device, memory 1518 is volatile, such as RAM, non-volatile, such as ROM, flash memory, etc., or some combination of the two. This configuration is illustrated in FIG. 15 by dashed line 1514.

In some embodiments, computing device 1512 includes additional features or functionality. For example, computing device 1512 also includes additional storage such as removable storage or non-removable storage, including, but not limited to, magnetic storage, optical storage, and the like. Such additional storage is illustrated in FIG. 15 by storage 1520. In some embodiments, computer readable instructions to implement one or more embodiments provided herein are in storage 1520. Storage 1520 also stores other computer readable instructions to implement an operating system, an application program, and the like. Computer readable instructions are loaded in memory 1518 for execution by processing unit 1516, for example.

The term "computer readable media" as used herein includes computer storage media. Computer storage media includes volatile and nonvolatile, removable and non-removable media implemented in any method or technology for storage of information such as computer readable instructions or other data. Memory 1518 and storage 1520 are examples of computer storage media. Computer storage media includes, but is not limited to, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium which can be used to store the desired information and which can be accessed by computing device 1512. Any such computer storage media is part of computing device 1512.

Computing device 1512 includes communication connection(s) 1526, in some embodiments, that allows computing device 1512 to communicate with other devices. Communication connection(s) 1526 includes, but is not limited to, a modem, a Network Interface Card (NIC), an integrated network interface, a radio frequency transmitter/receiver, an infrared port, a USB connection, or other interfaces for connecting computing device 1512 to other computing devices. Communication connection(s) 1526 includes a wired connection or a wireless connection in some embodiments. Communication connection(s) 1526 transmits and/or receives communication media in some embodiments.

The term "computer readable media" includes communication media. Communication media typically embodies computer readable instructions or other data in a "modulated data signal" such as a carrier wave or other transport mechanism and includes any information delivery media. The term "modulated data signal" includes a signal that has one or more of its characteristics set or changed in such a manner as to encode information in the signal.

Computing device 1512 includes input device(s) 1524 such as keyboard, mouse, pen, voice input device, touch input device, infrared cameras, video input devices, or any other input device. Output device(s) 1522 such as one or more displays, speakers, printers, or any other output device are also included in computing device 1512. Input device(s) 1524 and output device(s) 1522 are connected to computing device 1512 via a wired connection, wireless connection, or any combination thereof. In some embodiments, an input device or an output device from another computing device are used as input device(s) 1524 or output device(s) 1522 for computing device 1512. Computing device 1512 also includes communication connection(s) 1526 to facilitate communications with one or more other devices.

Components of computing device 1512 are connected by various interconnects, such as a bus. Such interconnects include a Peripheral Component Interconnect (PCI), such as PCI Express, a Universal Serial Bus (USB), firewire (IEEE 13104), an optical bus structure, and the like. In another embodiment, components of computing device 1512 are interconnected by a network. For example, memory 1518 is comprised of multiple physical memory units located in different physical locations interconnected by a network.

Storage devices utilized to store computer readable instructions are distributed across a network in some embodiments. For example, a computing device 1530 accessible via a network 1528 stores computer readable instructions to implement one or more embodiments provided herein. Computing device 1512 accesses computing device 1530 and downloads a part or all of the computer readable instructions for execution. Alternatively, computing device 1512 downloads pieces of the computer readable instructions, as needed, or some instructions are executed at computing device 1512 and some at computing device 1530.

According to some embodiments, a height adjustable semiconductor wafer support is provided that includes a chuck for supporting a semiconductor wafer, an adjustment mechanism having a top surface for supporting the chuck, and a stage coupled to the adjustment mechanism such that movement of the top surface of the adjustment mechanism relative to the stage changes a distance between the top surface of the adjustment mechanism and a top surface of the stage.

According to some embodiments, a height adjustable semiconductor wafer support is provided that includes a chuck for supporting a semiconductor wafer, an adjustment mechanism having a top surface for supporting the chuck, and a stage coupled to the adjustment mechanism such that movement, by a motor of the adjustment mechanism, of the top surface of the adjustment mechanism relative to the stage changes a distance between the top surface of the adjustment mechanism and a top surface of the stage.

According to some embodiments, a method for adjusting a height of a semiconductor wafer is provided that includes placing a chuck for supporting the semiconductor wafer on a top surface of an adjustment mechanism that supports the chuck, and activating the adjustment mechanism to change a distance between the top surface of the adjustment mechanism and a top surface of a stage that supports the adjustment mechanism.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc., depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A height adjustable semiconductor wafer support, comprising:
   a chuck for supporting a semiconductor wafer;
   an adjustment mechanism having a top surface for supporting the chuck, wherein the adjustment mechanism comprises:
      a wheel;
      a belt coupled to the wheel; and
      a shaft coupled to the wheel, wherein:
         a first end of the shaft defines the top surface of the adjustment mechanism, and
         movement of the belt in a first direction rotates the wheel in a first rotational direction;
   a stage coupled to the adjustment mechanism, wherein rotation of the wheel in the first rotational direction moves the shaft in a first vertical direction to change a distance between the top surface of the adjustment mechanism and a top surface of the stage, wherein the first vertical direction corresponds to a longitudinal axis of the shaft;
   a first shaft mating portion;
   a first wheel mating portion, wherein the first shaft mating portion mates with the first wheel mating portion as the wheel rotates to move the shaft in the first vertical direction;
   a second shaft mating portion; and
   a second stage mating portion, wherein the second shaft mating portion mates with the second stage mating portion to inhibit rotational movement of the shaft about the longitudinal axis as the shaft moves in the first vertical direction.

2. The height adjustable semiconductor wafer support of claim 1, wherein:
   movement of the belt in a second direction rotates the wheel in a second rotational direction, and
   rotation of the wheel in the second rotational direction moves the shaft in a second vertical direction, opposite the first vertical direction, to change the distance between the top surface of the adjustment mechanism and the top surface of the stage.

3. The height adjustable semiconductor wafer support of claim 2, wherein the adjustment mechanism comprises:
   a motor that moves the belt in at least one of the first direction or the second direction.

4. The height adjustable semiconductor wafer support of claim 3, comprising:
   a controller coupled to the motor; and
   an identification (ID) reader coupled to the controller, wherein the ID reader reads an ID of the semiconductor wafer and the controller controls the motor based upon the ID of the semiconductor wafer to change the distance between the top surface of the adjustment mechanism and the top surface of the stage.

5. The height adjustable semiconductor wafer support of claim 1, wherein at least one of:
   the first shaft mating portion comprises a first tab on the shaft and the first wheel mating portion comprises a first groove in the wheel,
   the first shaft mating portion comprises a first groove in the shaft and the first wheel mating portion comprises a first tab on the wheel,
   the second shaft mating portion comprises a second tab on the shaft and the second stage mating portion comprises a second groove in the stage, or
   the second shaft mating portion comprises a second groove in the shaft and the second stage mating portion comprises a second tab on the stage.

6. The height adjustable semiconductor wafer support of claim 1, comprising:
   a tensioner coupled to the belt to adjust tension in the belt.

7. The height adjustable semiconductor wafer support of claim 1, wherein the stage comprises a recess for receiving the shaft.

8. A height adjustable semiconductor wafer support, comprising:
   a chuck for supporting a semiconductor wafer;
   an adjustment mechanism having a top surface for supporting the chuck;
   a stage coupled to the adjustment mechanism such that movement of the top surface of the adjustment mechanism relative to the stage changes a distance between the top surface of the adjustment mechanism and a top surface of the stage, wherein a motor is configured to generate the movement;
   a controller coupled to the motor; and
   an identification (ID) reader coupled to the controller, wherein the ID reader reads an ID of the semiconductor wafer and the controller controls the motor based upon the ID of the semiconductor wafer to change the distance between the top surface of the adjustment mechanism and the top surface of the stage.

9. The height adjustable semiconductor wafer support of claim 8, wherein the adjustment mechanism comprises:
a shaft coupled to the motor, wherein a first end of the shaft defines the top surface of the adjustment mechanism.

10. The height adjustable semiconductor wafer support of claim 9, comprising:
a belt coupled to the motor and the shaft, wherein the motor moves the belt and movement of the belt in a first direction moves the shaft in a first vertical direction to change the distance between the top surface of the adjustment mechanism and the top surface of the stage, wherein the first vertical direction corresponds to a longitudinal axis of the shaft.

11. The height adjustable semiconductor wafer support of claim 10, comprising:
a wheel coupled to the belt and the shaft, wherein the movement of the belt in the first direction rotates the wheel in a first rotational direction and rotation of the wheel in the first rotational direction moves the shaft in the first vertical direction.

12. The height adjustable semiconductor wafer support of claim 11, wherein:
movement of the belt in a second direction rotates the wheel in a second rotational direction, and
rotation of the wheel in the second rotational direction moves the shaft in a second vertical direction, opposite the first vertical direction, to change the distance between the top surface of the adjustment mechanism and the top surface of the stage.

13. The height adjustable semiconductor wafer support of claim 11, comprising:
a first shaft mating portion; and
a first wheel mating portion, wherein the first shaft mating portion mates with the first wheel mating portion as the wheel rotates to move the shaft in the first vertical direction.

14. The height adjustable semiconductor wafer support of claim 13, comprising:
a second shaft mating portion; and
a second stage mating portion, wherein the second shaft mating portion mates with the second stage mating portion to inhibit rotational movement of the shaft about the longitudinal axis as the shaft moves in the first vertical direction.

15. The height adjustable semiconductor wafer support of claim 14, wherein at least one of:
the first shaft mating portion comprises a first tab on the shaft and the first wheel mating portion comprises a first groove in the wheel,
the first shaft mating portion comprises a first groove in the shaft and the first wheel mating portion comprises a first tab on the wheel,
the second shaft mating portion comprises a second tab on the shaft and the second stage mating portion comprises a second groove in the stage, or
the second shaft mating portion comprises a second groove in the shaft and the second stage mating portion comprises a second tab on the stage.

16. A height adjustable semiconductor wafer support, comprising:
a chuck for supporting a semiconductor wafer;
an adjustment mechanism having a top surface for supporting the chuck, wherein the adjustment mechanism comprises a shaft, wherein a first end of the shaft defines the top surface of the adjustment mechanism;
a stage coupled to the adjustment mechanism such that movement of the top surface of the adjustment mechanism relative to the stage changes a distance between the top surface of the adjustment mechanism and a top surface of the stage;
a belt coupled to a motor and the shaft;
a wheel coupled to the belt and the shaft, wherein the motor moves the belt and movement of the belt in a first direction rotates the wheel in a first rotational direction and rotation of the wheel in the first rotational direction moves the shaft in a first vertical direction to change the distance between the top surface of the adjustment mechanism and the top surface of the stage, wherein the first vertical direction corresponds to a longitudinal axis of the shaft;
a first shaft mating portion;
a first wheel mating portion, wherein the first shaft mating portion mates with the first wheel mating portion as the wheel rotates to move the shaft in the first vertical direction;
a second shaft mating portion; and
a second stage mating portion, wherein the second shaft mating portion mates with the second stage mating portion to inhibit rotational movement of the shaft about the longitudinal axis as the shaft moves in the first vertical direction.

17. The height adjustable semiconductor wafer support of claim 16, wherein:
movement of the belt in a second direction rotates the wheel in a second rotational direction, and
rotation of the wheel in the second rotational direction moves the shaft in a second vertical direction, opposite the first vertical direction, to change the distance between the top surface of the adjustment mechanism and the top surface of the stage.

18. The height adjustable semiconductor wafer support of claim 16, wherein:
the first shaft mating portion comprises a first tab on the shaft and the first wheel mating portion comprises a first groove in the wheel, or
the first shaft mating portion comprises a first groove in the shaft and the first wheel mating portion comprises a first tab on the wheel.

19. The height adjustable semiconductor wafer support of claim 16, wherein:
the second shaft mating portion comprises a second tab on the shaft and the second stage mating portion comprises a second groove in the stage, or
the second shaft mating portion comprises a second groove in the shaft and the second stage mating portion comprises a second tab on the stage.

20. The height adjustable semiconductor wafer support of claim 16, comprising:
a tensioner coupled to the belt to adjust tension in the belt.

* * * * *